US012766461B2

(12) United States Patent
Altecor et al.

(10) Patent No.: US 12,766,461 B2
(45) Date of Patent: Oct. 20, 2026

(54) COMPACT GAS SEPARATOR DEVICES CO-LOCATED ON SUBSTRATE PROCESSING SYSTEMS

(71) Applicant: LAM RESEARCH CORPORATION, Fremont, CA (US)

(72) Inventors: Aleksey V. Altecor, Newberg, OR (US); Andrew Borth, Newberg, OR (US); Chi-Jung Cheng, Wilsonville, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 345 days.

(21) Appl. No.: 18/683,605

(22) PCT Filed: Aug. 17, 2022

(86) PCT No.: PCT/US2022/040613
§ 371 (c)(1),
(2) Date: Feb. 14, 2024

(87) PCT Pub. No.: WO2023/027927
PCT Pub. Date: Mar. 2, 2023

(65) Prior Publication Data
US 2025/0121320 A1 Apr. 17, 2025

Related U.S. Application Data
(60) Provisional application No. 63/236,014, filed on Aug. 23, 2021.

(51) Int. Cl.
*B01D 53/26* (2006.01)
*B01D 53/30* (2006.01)
(Continued)

(52) U.S. Cl.
CPC .......... *B01D 53/265* (2013.01); *B01D 53/30* (2013.01); *C23C 16/4402* (2013.01);
(Continued)

(58) Field of Classification Search
CPC ................. B01D 53/265; B01D 53/30; B01D 2258/0216; B01D 2259/818; C23C 16/4402; C23C 16/455; C23C 16/45561
See application file for complete search history.

(56) References Cited

U.S. PATENT DOCUMENTS 7,314,506 B2 1/2008 Vininski et al.
9,378,931 B2 6/2016 Kwon et al.
(Continued)

FOREIGN PATENT DOCUMENTS

KR 20160050396 A 5/2016
WO WO-2010103846 A1 9/2010
WO WO-2021096670 A1 5/2021

OTHER PUBLICATIONS

International Search Report and Written Opinion of the ISA issued in PCT/US2022/040613, mailed Dec. 7, 2022; ISA/KR.

*Primary Examiner* — Robert Clemente

(57) ABSTRACT

A gas separator device includes a first chamber including a first inlet to receive a gas mixture comprising first and second gases, and a first outlet. First and second Peltier devices are mounted to the first chamber to cool the first chamber to a first temperature. A second chamber is connected to the first chamber and includes a second outlet. Third and fourth Peltier devices are mounted to the first and second Peltier devices, respectively, and to the second chamber to cool the second chamber to a second temperature. The Peltier devices are configured to condense the second gas in the gas mixture in the first chamber and output the first gas via the first outlet. The Peltier devices are configured to transform the condensed second gas received
(Continued)

from the first chamber in the second chamber into the second gas and output the second gas via the second outlet.

10 Claims, 8 Drawing Sheets

(51) Int. Cl.
*C23C 16/44* (2006.01)
*C23C 16/455* (2006.01)
(52) U.S. Cl.
CPC .................. *C23C 16/45561* (2013.01); *B01D 2258/0216* (2013.01); *B01D 2259/818* (2013.01)

(56) References Cited

U.S. PATENT DOCUMENTS

| | | | | |
|---|---|---|---|---|
| 9,515,633 | B1 | 12/2016 | Long et al. | |
| 10,815,209 | B1 * | 10/2020 | Duff | C07D 301/32 |
| 2006/0032269 | A1 | 2/2006 | Cuellar et al. | |
| 2007/0227186 | A1 | 10/2007 | Alferov et al. | |
| 2009/0158613 | A1 * | 6/2009 | Aihara | H10P 70/00 34/409 |
| 2009/0263257 | A1 * | 10/2009 | Rameau | B01J 4/008 417/55 |
| 2011/0311724 | A1 | 12/2011 | Jensen et al. | |
| 2013/0291730 | A1 | 11/2013 | Varesi et al. | |
| 2017/0162368 | A1 | 6/2017 | Marakhtanov et al. | |
| 2018/0240647 | A1 | 8/2018 | McChesney et al. | |
| 2019/0295821 | A1 | 9/2019 | Shoeb et al. | |

* cited by examiner

| State | V1 | V2 | V3 | V4 | V5 | V6 |
|---|---|---|---|---|---|---|
| Error/ILK | X | X | X | X | X | X |
| Flow to PM | X | O | X | O | X | X |
| Flow to divert | DC | DC | X | X | O | X |
| Move liquid | X | X | O | X | X | X |
| Purge | O | X | O | X | O | DC |

COMPACT GAS SEPARATOR DEVICES CO-LOCATED ON SUBSTRATE PROCESSING SYSTEMS

CROSS-REFERENCE TO RELATED APPLICATIONS

This application is a U.S. National Phase Application under 35 U.S.C. 371 of International Application No. PCT/US2022/040613, filed on Aug. 17, 2022, which claims the benefit of U.S. Provisional Application No. 63/236,014, filed on Aug. 23, 2021. The entire disclosures of the applications referenced above are incorporated herein by reference.

FIELD

The present disclosure relates generally to substrate processing systems and more particularly to compact gas separator devices that are co-located on substrate processing systems.

BACKGROUND

The background description provided here is for the purpose of generally presenting the context of the disclosure. Work of the presently named Applicants, to the extent it is described in this background section, as well as aspects of the description that may not otherwise qualify as prior art at the time of filing, are neither expressly nor impliedly admitted as prior art against the present disclosure.

A substrate processing system typically comprises a plurality of stations (also called processing chambers or process modules) that perform deposition, etching, and other treatments on substrates such as semiconductor wafers. Examples of processes that may be performed on a substrate comprises a chemical vapor deposition (CVD) process, a chemically enhanced plasma vapor deposition (CEPVD) process, a plasma enhanced chemical vapor deposition (PECVD) process, a sputtering physical vapor deposition (PVD) process, atomic layer deposition (ALD), and plasma enhanced ALD (PEALD). Additional examples of processes that may be performed on a substrate comprise, but are not limited to, etching (e.g., chemical etching, plasma etching, reactive ion etching, atomic layer etching (ALE), plasma enhanced ALE (PEALE), etc.) and cleaning processes.

During processing, a substrate is arranged on a substrate support such as a pedestal in a station. During deposition, gas mixtures comprising one or more precursors are introduced into the station, and plasma may be optionally struck to activate chemical reactions. During etching, gas mixtures comprising etch gases are introduced into the station, and plasma may be optionally struck to activate chemical reactions. A computer-controlled robot typically transfers substrates from one station to another in a sequence in which the substrates are to be processed.

Atomic Layer Deposition (ALD) is a thin-film deposition method that sequentially performs a gaseous chemical process to deposit a thin film on a surface of a material (e.g., a surface of a substrate such as a semiconductor wafer). Most ALD reactions use at least two chemicals called precursors (reactants) that react with the surface of the material one precursor at a time in a sequential, self-limiting manner. Through repeated exposure to separate precursors, a thin film is gradually deposited on the surface of the material. Thermal ALD (T-ALD) is carried out in a heated processing chamber. The processing chamber is maintained at a sub-atmospheric pressure using a vacuum pump and a controlled flow of an inert gas. The substrate to be coated with an ALD film is placed in the processing chamber and is allowed to equilibrate with the temperature of the processing chamber before starting the ALD process. Atomic layer etching comprises a sequence. The sequence alternates between self-limiting chemical modification steps and etching steps. The chemical modification steps affect only top atomic layers of a substrate. The etching steps remove only the chemically-modified areas from the substrate. The sequence allows removal of individual atomic layers from the substrate.

SUMMARY

A gas separator device comprises a first chamber, first and second Peltier devices, a second chamber, and third and fourth Peltier devices. The first chamber comprises a first inlet to receive a gas mixture comprising first and second gases, and a first outlet. The first and second Peltier devices are mounted to the first chamber to cool the first chamber to a first temperature. The second chamber is connected to the first chamber and comprises a second outlet. The third and fourth Peltier devices are mounted to the first and second Peltier devices, respectively, and to the second chamber to cool the second chamber to a second temperature that is greater than the first temperature. The first, second, third, and fourth Peltier devices are configured to condense the second gas in the gas mixture in the first chamber and output the first gas via the first outlet. The first, second, third, and fourth Peltier devices are configured to transform the condensed second gas received from the first chamber in the second chamber into the second gas and output the second gas via the second outlet.

In additional features, the gas separator device further comprises a controller configured to supply a first voltage to the first and second Peltier devices to cool the first chamber to the first temperature and a second voltage to the third and fourth Peltier devices to cool the second chamber to the second temperature.

In additional features, the gas separator device further comprises a cooling assembly attached to the third and fourth Peltier devices to cool opposite sides of the third and fourth Peltier device to a third temperature that is greater than the second temperature.

In additional features, the gas separator device further comprises a valve selectively connecting the first and second chambers and a controller to control the valve to selectively transfer the condensed second gas from the first chamber to the second chamber.

In additional features, the gas separator device further comprises a level sensor to sense a level of the condensed second gas in the first chamber. The controller is configured to control the valve based on the level.

In additional features, the first outlet supplies the first gas to a substrate processing chamber via a mass flow controller, and the second outlet supplies the second gas to an abatement device.

In additional features, the gas separator device is located in a substrate processing tool.

In additional features, the gas separator device further comprises a plurality of valves and a controller to control the valves. The controller is configured to control the valves to at least one of: shut down the gas separator device in response to an error, control flow of the first gas from the first outlet to a substrate processing chamber, divert flow of the first gas from the second outlet to an abatement device, purge the gas separator device, and prevent backflow of gases from the gas separator device into systems upstream of the gas separator device.

In additional features, a system comprises a plurality of the gas separator device, a plurality of substrate processing chambers, and an abatement device. A first gas separator device of the plurality of the gas separator device receives the gas mixture, supplies the first gas to a first one of the substrate processing chambers, and supplies the second gas to the abatement device. A second gas separator device of the plurality of the gas separator device receives the gas mixture, supplies the first gas to a second one of the substrate processing chambers, and supplies the second gas to the abatement device.

In additional features, a third gas separator device of the plurality of the gas separator device receives the gas mixture, and in response to the first gas separator device failing, supplies the first gas to the first one of the substrate processing chambers and supplies the second gas to the abatement device.

In still other features, a system comprises first, second, and third gas separator devices. The first gas separator device is configured to receive a gas mixture comprising first and second gases, to separate the first and second gases, to supply the first gas to a first substrate processing chamber, and to supply the second gas to an abatement device. The second gas separator device is configured to receive the gas mixture, to separate the first and second gases, to supply the first gas to a second substrate processing chamber, and to supply the second gas to the abatement device. The third gas separator device is configured to receive the gas mixture, to separate the first and second gases, and in response to the first gas separator device failing, to supply the first gas to the first substrate processing chamber and to supply the second gas to the abatement device. The first, second, and third gas separator devices are located in a substrate processing tool comprising the first and second substrate processing chambers.

In additional features, each of the first, second, and third gas separator devices comprises a first chamber, first and second Peltier devices, a second chamber, and third and fourth Peltier devices. The first chamber comprises a first inlet to receive the gas mixture and a first outlet connected to a respective one of the substrate processing chambers. The first and second Peltier devices are mounted to the first chamber to cool the first chamber to a first temperature. The second chamber is connected to the first chamber and comprises a second outlet connected to the abatement device. The third and fourth Peltier devices are mounted to the first and second Peltier devices, respectively, and to the second chamber to cool the second chamber to a second temperature that is greater than the first temperature. The first, second, third, and fourth Peltier devices are configured to condense the second gas in the gas mixture in the first chamber and output the first gas via the first outlet. The first, second, third, and fourth Peltier devices are configured to transform the condensed second gas received from the first chamber in the second chamber into the second gas and output the second gas via the second outlet.

In additional features, each of the first, second, and third gas separator devices further comprises a controller configured to supply a first voltage to the first and second Peltier devices to cool the first chamber to the first temperature and a second voltage to the third and fourth Peltier devices to cool the second chamber to the second temperature.

In additional features, each of the first, second, and third gas separator devices comprises a cooling assembly attached to the third and fourth Peltier devices to cool opposite sides of the third and fourth Peltier device to a third temperature that is greater than the second temperature.

In additional features, each of the first, second, and third gas separator devices further comprises a valve selectively connecting the first and second chambers, and a controller configured to control the valve to selectively transfer the condensed second gas from the first chamber to the second chamber.

In additional features, each of the first, second, and third gas separator devices further comprises a level sensor to sense a level of the condensed second gas in the first chamber. The controller is configured to control the valve based on the level.

In additional features, each of the first, second, and third gas separator devices further comprises a plurality of valves, and a controller. The controller is configured to control the valves to at least one of: shut down the gas separator device in response to an error, control flow of the first gas from the first outlet to a respective one of the substrate processing chambers, divert flow of the first gas from the second outlet to an abatement device, purge the gas separator device, and prevent backflow of gases from the gas separator device into systems upstream of the gas separator device.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
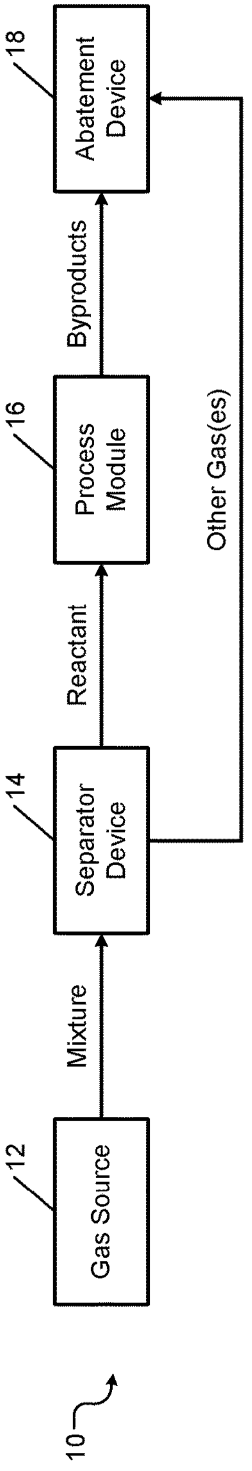
FIG. 1 shows a block diagram of a system comprising a gas separator device (hereinafter the separator device) according to the present disclosure.

The present disclosure provides a compact gas separator device. The compact gas separator device performs in-situ gas purification for delivering process gases to process modules of substrate processing systems. Throughout the present disclosure, the substrate processing systems are also called substrate processing tools or simply tools. The gas separator device (hereinafter "the separator device") receives a gas mixture from a gas source. The separator device outputs two separate gas streams instead of a gas-plus-liquid stream. The two separate gas streams are called primary and secondary gas streams. Subsequently, both the gas streams can be supplied to a process module through respective mass flow controllers (MFCs). Alternatively, the primary gas stream is supplied to the process module. The secondary gas stream, if unwanted, can bypass the process module and can be processed by an abatement system. Due to its compact size, the separator device can be co-located with the gasbox on the tool itself instead of being located remotely from the tool. The separator device uses two or more Peltier stages. The separator device comprises no moving parts such as a pump, which reduces failure rate of the separator device.

The separator device comprises a compact dual-stage (i.e., dual chamber) gas separation system. The gas separation system separates gases by condensation from a gas mixture. The gas separation system allows one of the separated gases to be supplied to a process module. The gas separation system allows other separated gases to bypass the process module. The separator device comprises dual Peltier thermal control stages. The dual Peltier thermal control stages allow both condensation and re-evaporation of the gas that is to be bypassed. The separator device allows precise control of concentration and flow of a precursor gas through the MFC into the process module. The precise control of concentration and flow of the precursor gas provides significant improvements in throughput and film quality.

Currently, the gas separation is performed remotely from the tools using a large gas cabinet style apparatus. The apparatus is located in a section of a semiconductor fabrication plant (fab) called a subfab. The subfab houses support equipment such as chemical delivery, purification, recycling, and destruction systems for tools in a cleanroom. In contrast, the separator device is compact and can be co-located on the tool itself. Further, due to its compact size, multiple separator devices can be provided on the tool. For example, one separator device per process module can be provided. A spare separator device per process module can be provided. A spare separator device can be shared between the separator devices for two or more process modules, and so on. The compact size of the separator device allows the separator device to be co-located within or immediately adjacent to a gasbox on the tool. The co-location reduces total system footprint and cost compared to the alternative.

The separator device separates a precursor gas from a solvent. The separator device is arranged between the gas supply and the MFC upstream of the process module. The gas separation is useful in controlling supply of reactant species to the process modules. For example, in some processes, a carbon-based patterning film is used to provide better selectivity to and protection of underlying layers of a substrate than conventional photoresist. The film is removed by a dry process, such as ashing.

In processes involving deposition of carbon films, generally any carbon-containing chemical (e.g., a solvent in which a reactant is stored) will deposit a carbon film. Stringent controls are employed to control contamination, doping, conductivity, mechanical properties etc. of the film. Multiple reactants produce multiple products, which in turn continue to react with each other. Sometimes the reactions can be reversible, due to which the finally produced film is difficult to predict and control. The separator device drives the chemical reactions in a single direction and towards one or two specific known products with as few reactants as possible.

Further, the separator device provides other advantages. For example, some reactants and solvents can pose safety hazards. Separating and disposing them in compliance with safety regulations can be challenging. For example, a reactant such as pure acetylene gas cannot be compressed and stored without the danger of explosion. Typically, acetylene is compressed in the presence of dimethylformamide (DMF), which forms a safe, concentrated solution.

Acetylene is not a particularly stable compound and tends to decompose over time. The decomposition can be triggered by external factors such as mechanical shock (e.g., sudden pressure or temperature change). The decomposition is energetic, which means a high mass concentration of acetylene (e.g., a cylinder at high pressure) can detonate. For this reason, acetylene gas is rarely stored in its pure form.

Instead, the acetylene gas stored as dissolved in a liquid (like a carbonated drink) at a limited pressure. During use, the pressure on the cylinder is released, which allows the gas to precipitate out from the liquid and be usable. Typically, the liquid used is DMF. DMF has low vapor pressure at room temperature (i.e., high boiling point at 1 atmosphere). Accordingly, trace amounts of DMF at the outlet of the cylinder are low (e.g., a low enough amount of DMF such that the DMF would not be considered as a reactant).

However, DMF is a toxic chemical and is banned in some countries. Instead, acetone is used as liquid. However, acetone has a higher vapor pressure (i.e., lower boiling point at 1 atmosphere) than acetylene. Consequently, a higher fraction of acetone vapor is present at the cylinder outlet, which can produce unwanted reactions and film deposition. More problematically, the maximum pressure at which cylinders storing acetylene can be stored is also low. As the cylinder pressure lowers over the course of consumption, the ratio of acetone/acetylene at the outlet shifts significantly, which in turn can degrade film quality.

Presence of any significant quantity of acetone as a reactant adversely affects the film being targeted. The variability in the acetone/acetylene ratio produces inconsistent results. Without separation or stabilization mechanism, no two wafers processed in a process module come out (reasonably close to) the same. The separator device solves these problems by separating acetone from acetylene. Thereafter, acetone can be bypassed from the process module and can be safely handled (e.g., using an abatement system).

The separator device functions like a black box that receives a mixture of gases and outputs two (or more) separated gases as opposed to a gas-plus-liquid mixture, etc. The separation mechanism is physical (i.e., based on Peltier effect, which is temperature based). The separation mechanism does not involve any chemical reactions (or moving parts like pumps). Accordingly, each output stream will only contain the compounds present in the input mixture. Both the primary and secondary (i.e., byproduct) outputs can be used for processing substrates. Alternatively, the secondary byproduct(s) can be abated.

The separator device is not limited to only two gases or stages. For a different input mixture with multiple gases of differing boiling points, additional stages (i.e., additional chambers as well as additional Peltier stages) may be used. The additional stages may have additional temperature setpoints to individually separate out the gases (e.g., when the acetone-acetylene mixture is also contaminated with water).

The compact size allows the separator device to be integrated close to the point-of-use (e.g., in atomic layer deposition or ALD process modules where total mass flow of gas is stringently controlled). The compact size also allows the separator device to be scaled in parallel redundant configurations for processes where gas flow requirements are higher than that achievable with a single separator device. Configurations with multiple separator devices scale their combined flow capability linearly (i.e., N separator devices have N times the flow capacity of a single separator device). Additional separator devices can be used to provide redundancy for increased production uptime. For example, in a 3-by-2 configuration (i.e., 3 separator devices used with 2 process modules), two of the three separator devices respectively provide gas separation from one supply cylinder to two process modules. Each of the two separator devices is sized to meet flow requirements for one process module. The third separator device provides redundancy. If one of the two separator devices fails, the third separator device takes the place of the failed separator device. The system as a whole can continue functioning uninterrupted while maintenance is scheduled and performed.

Figure 2:
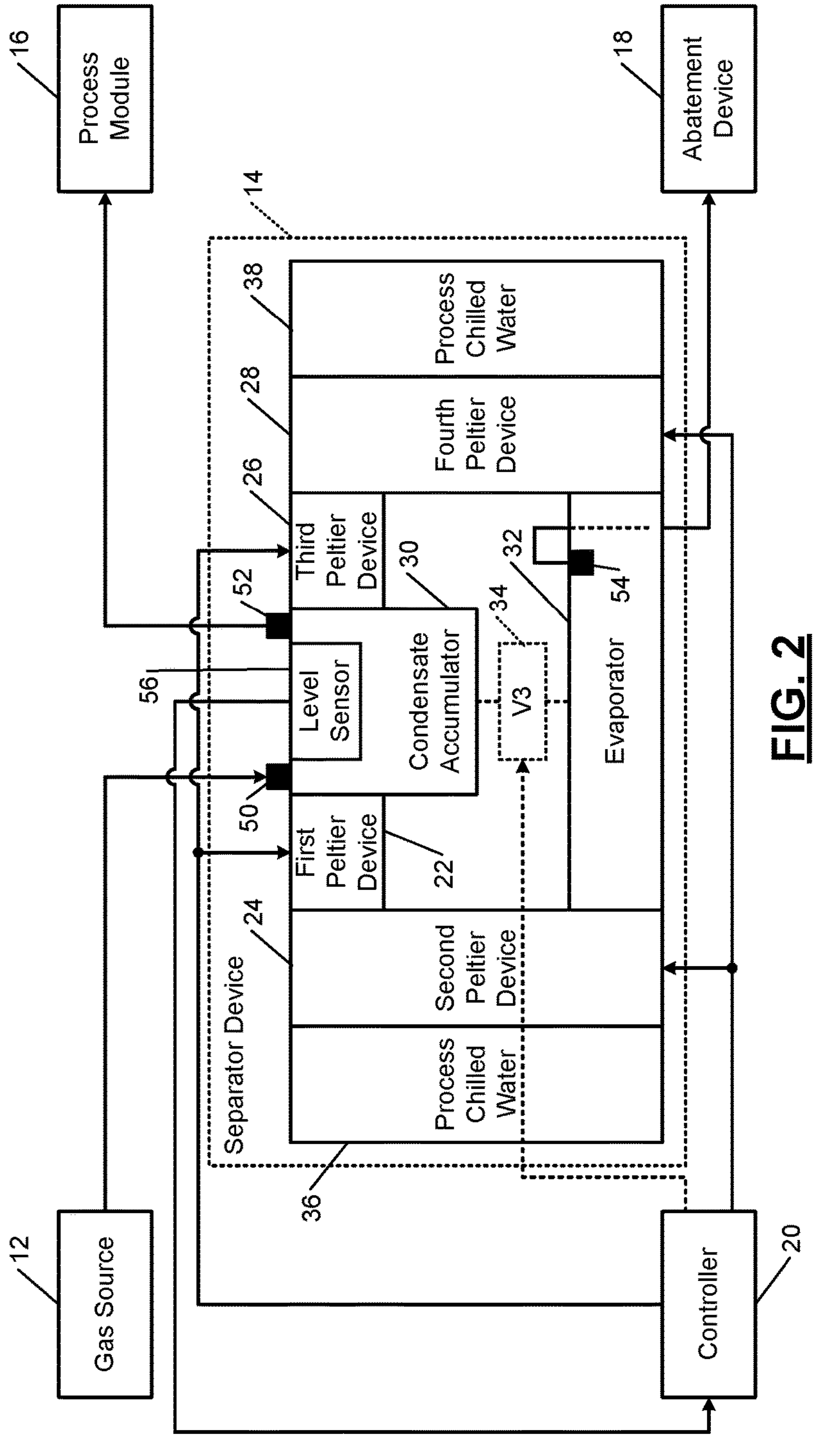
FIG. 2 shows an example of the separator device according to the present disclosure.
Figure 3A:
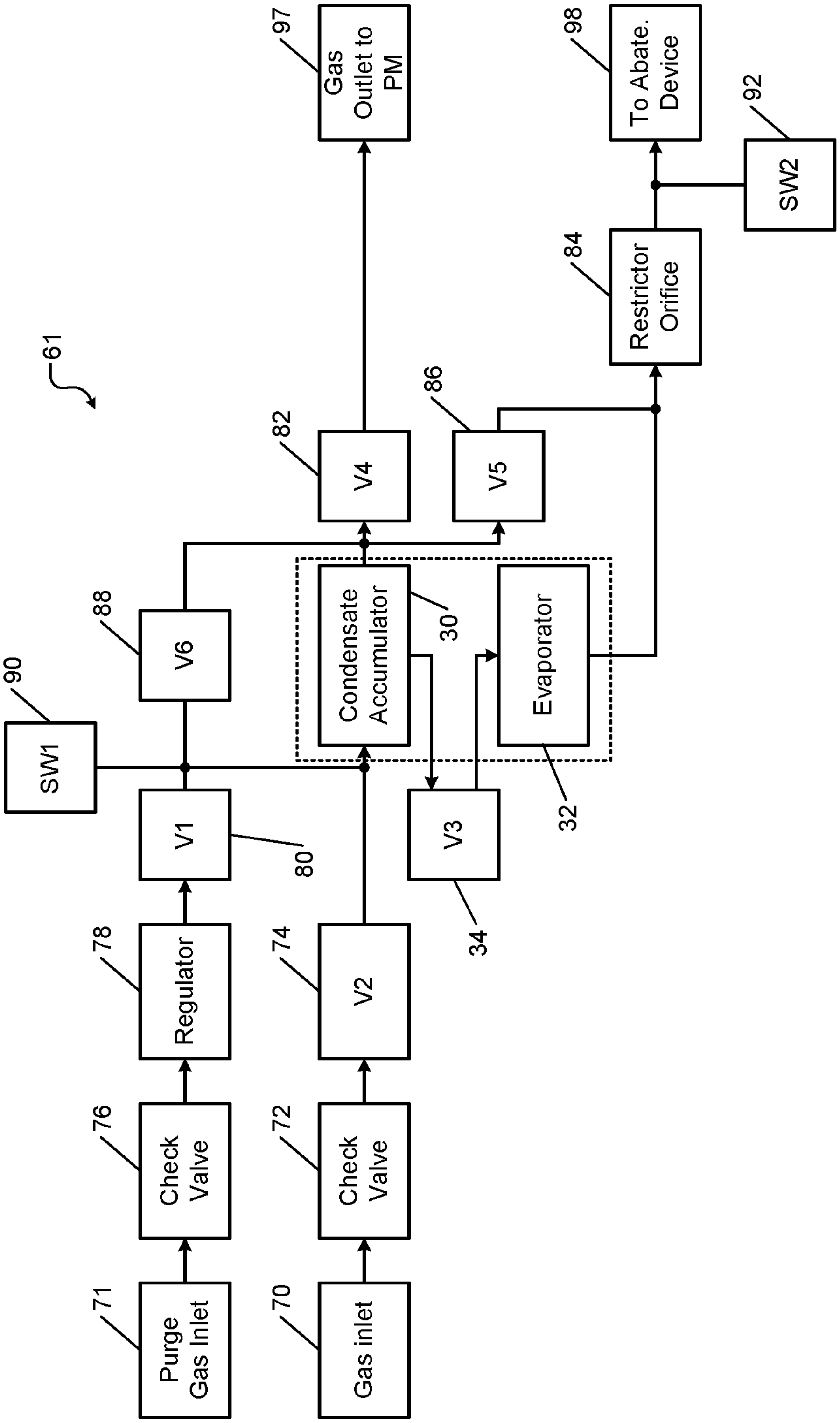
FIGS. 3A-3C show a system of valves used with the separator device according to the present disclosure.
Figures 3B, 3C:
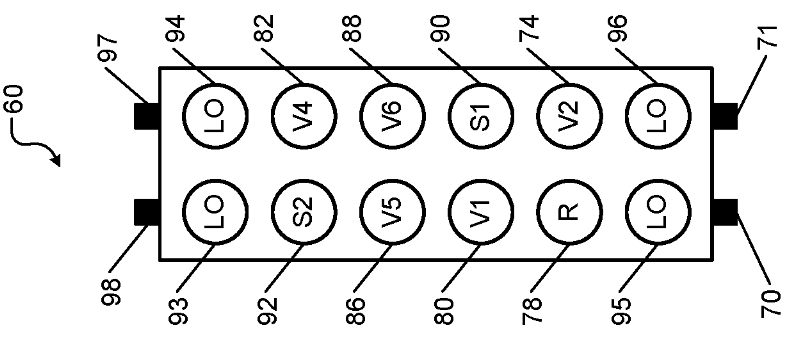
Figure 4:
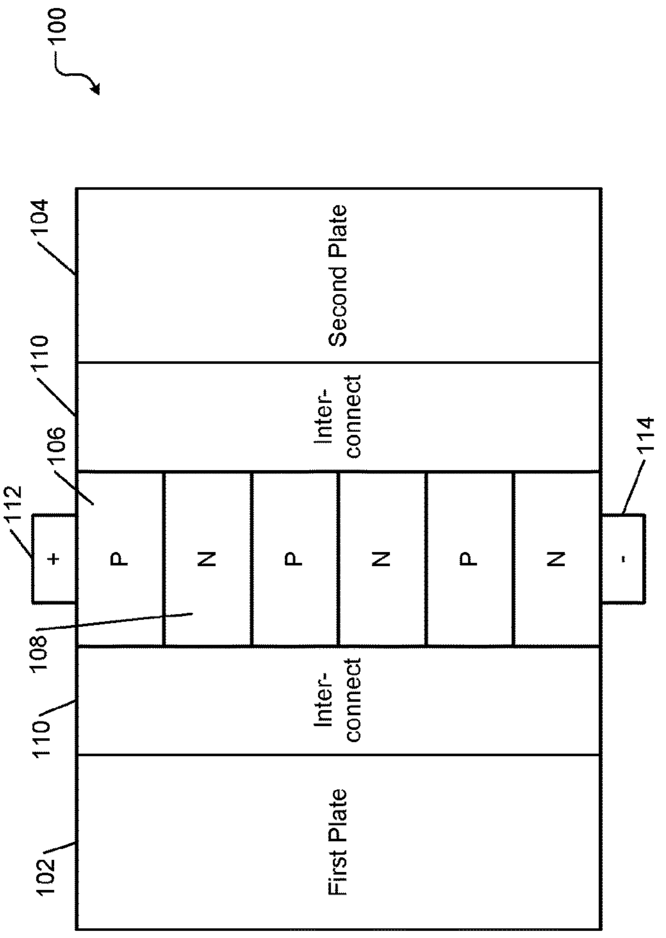
FIG. 4 shows an example of a Peltier device used with the separator device according to the present disclosure.
Figure 5:
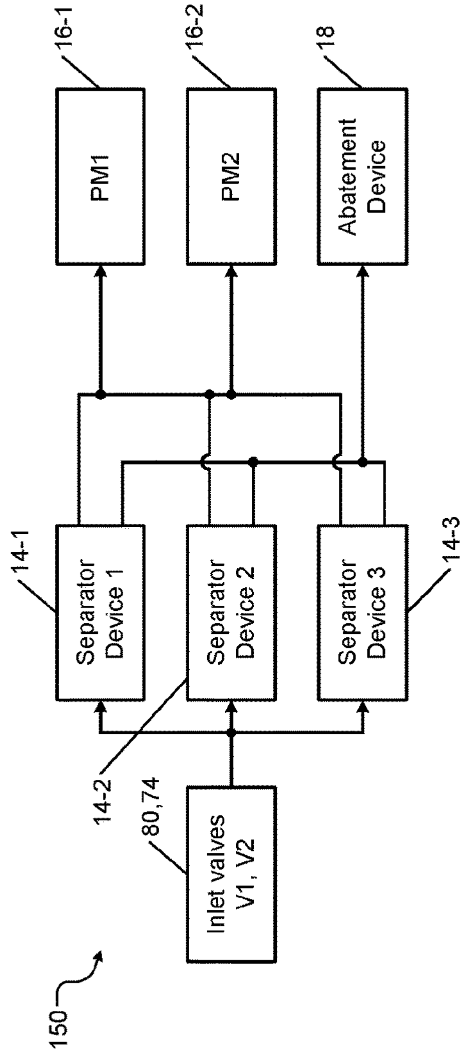
FIG. 5 shows an example of a system comprising multiple separator devices comprising a redundant separator device used with multiple process modules according to the present disclosure.
Figure 6A:
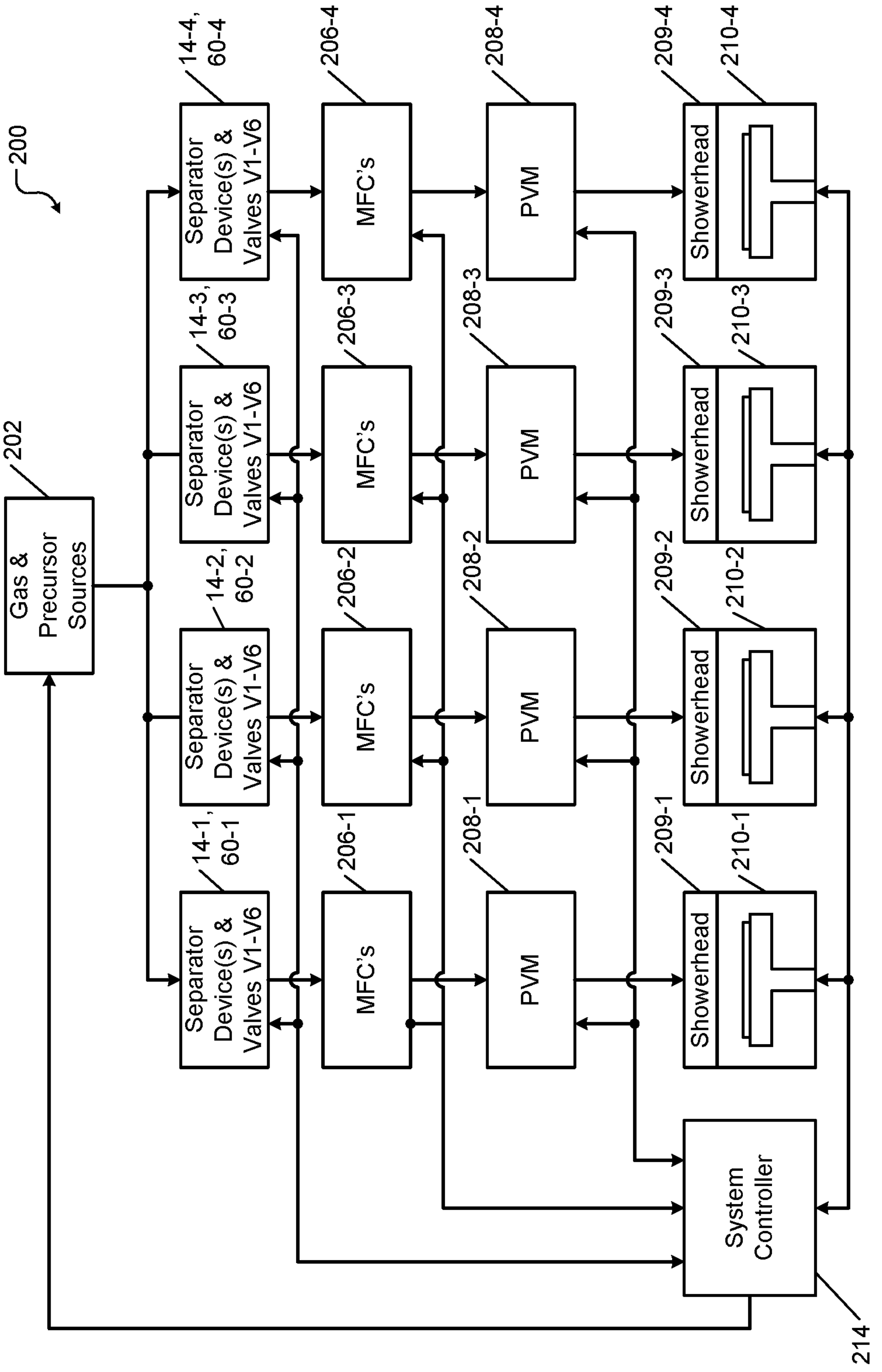
FIGS. 6A and 6B show examples of substrate processing systems comprising multiple process modules and multiple separator devices according to the present disclosure.
Figure 6B:
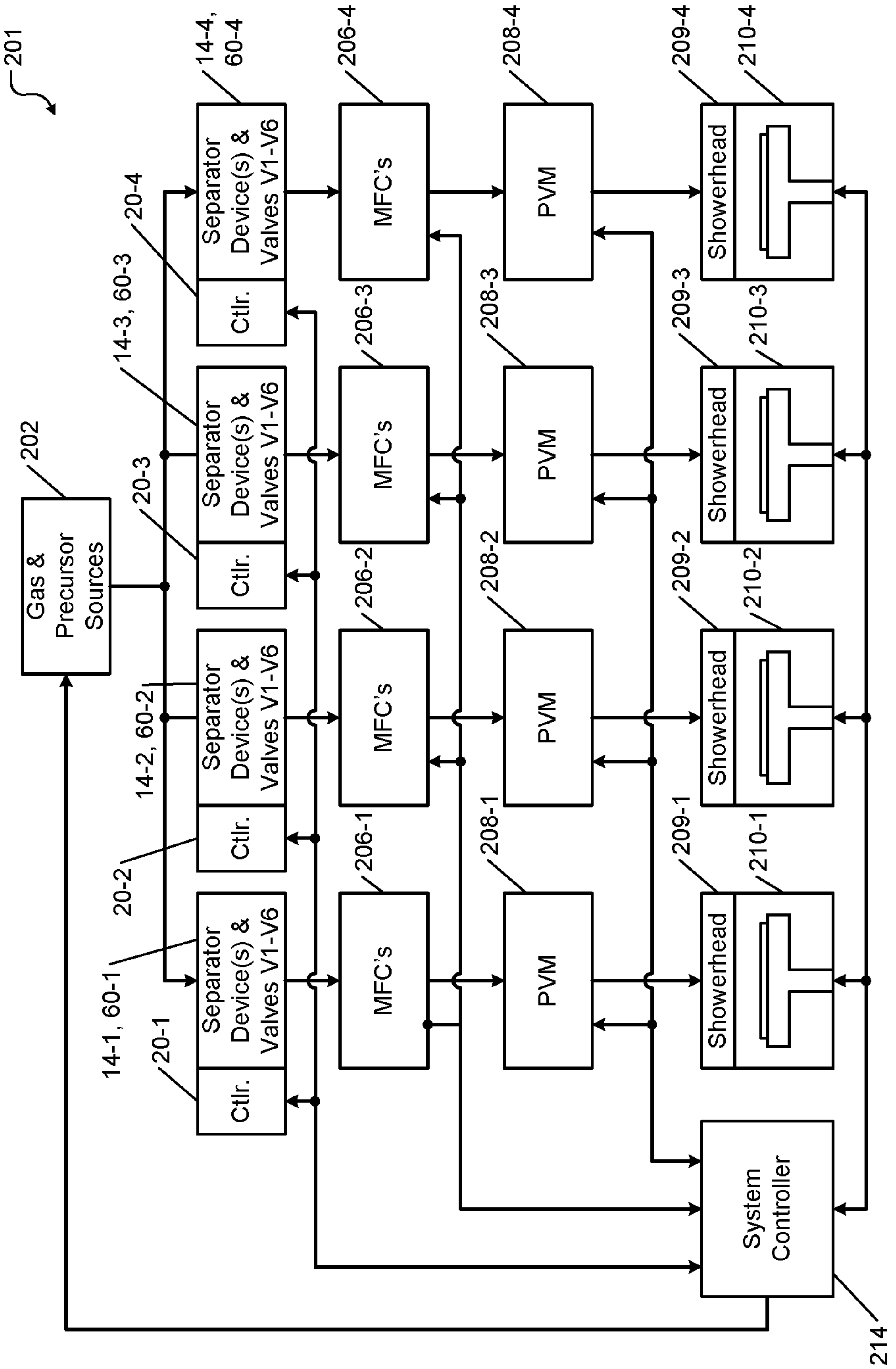
Figure 7:
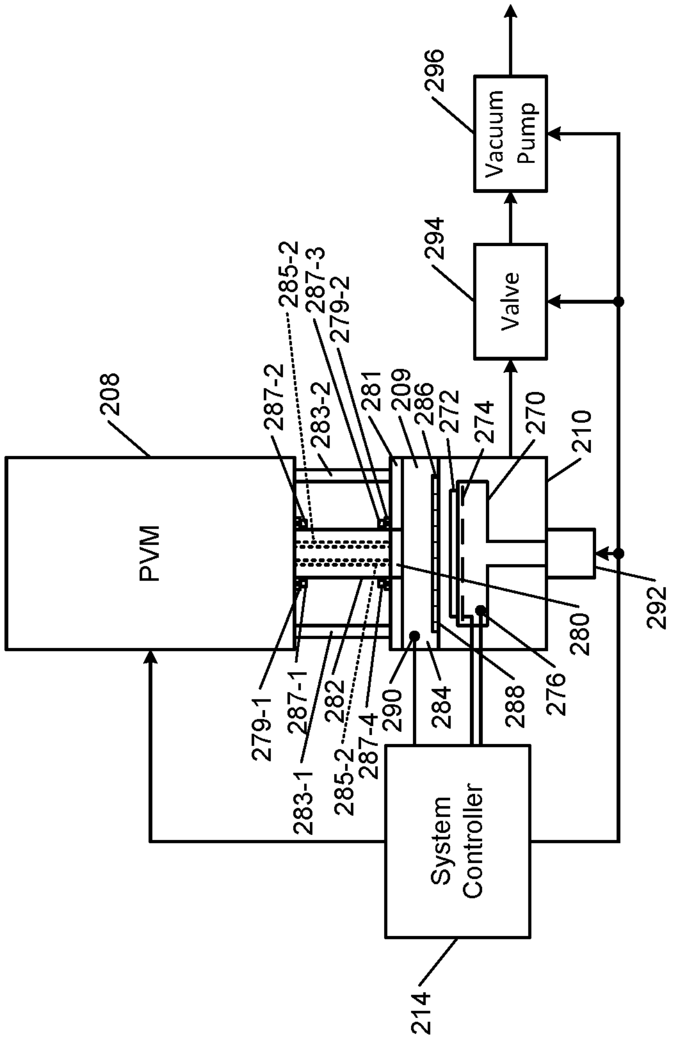
FIGS. 7 and 8 show non-limiting examples of process modules used in the substrate processing systems of FIGS. 6A and 6B.
Figure 8:
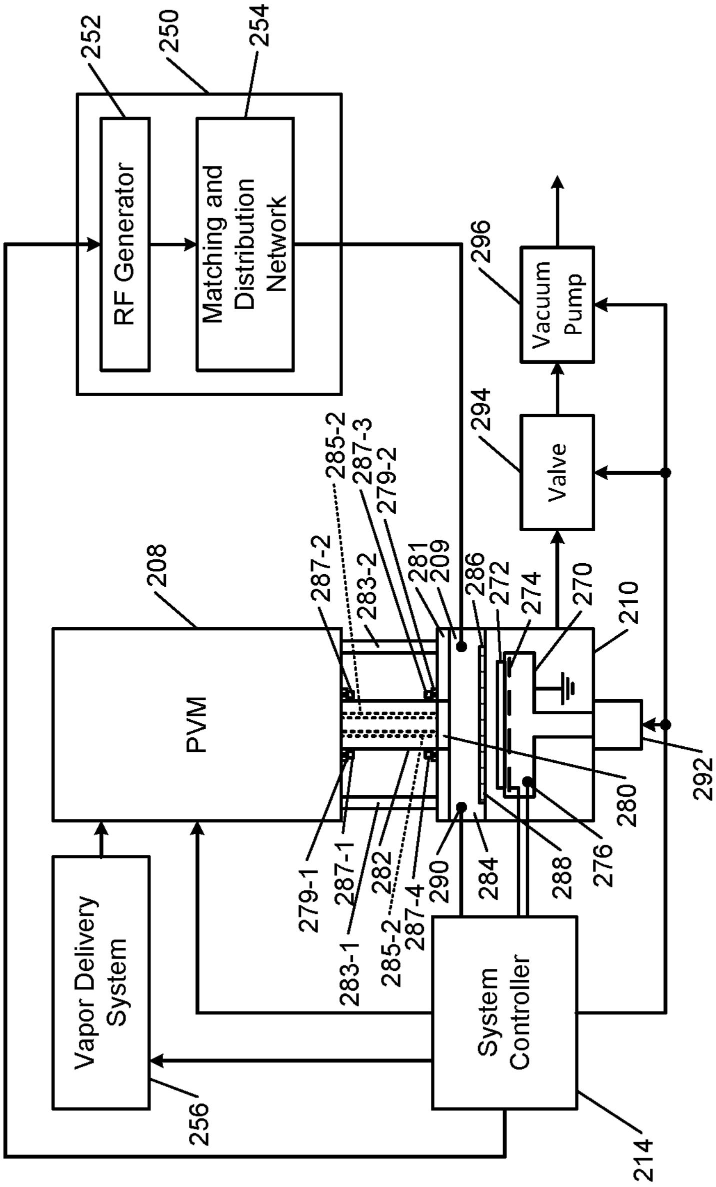

The present disclosure is organized as follows. FIG. 1 shows a general block diagram of a system comprising the separator device. FIG. 2 shows an example of the separator device in detail. FIGS. 3A-3C show various valves used with the separator device. FIG. 4 shows an example of a Peltier device used with the separator device. FIG. 5 shows an example of using a redundant separator device. FIGS. 6A and 6B show examples of tools comprising multiple process modules and separator devices. FIGS. 7 and 8 show non-limiting examples of process modules used in the tools shown in FIGS. 6A and 6B. FIG. 7 shows an example of an ALD process module, and FIG. 8 shows an example of a plasma enhanced chemical vapor deposition (PECVD) process module.

FIG. 1 shows a general block diagram of a system 10 comprising the separator device according to the present disclosure. The system 10 comprises a gas source 12, a separator device 14, a process module 16, and an abatement device 18. The gas source 12 supplies a gas or more commonly a gas mixture comprising two or more constituent gases. For example, the constituent gases in the gas mixture comprise a reactant gas to be supplied to the process module 16 via a MFC (shown in FIGS. 6A and 6B) and one or more other gases. The separator device 14 receives the gas mixture and outputs two or more constituent gases from the gas mixture. For example, the separator device 14 separates the reactant from the other gases in the gas mixture. The reactant is supplied via the MFC to the process module 16. The other gases are supplied to the abatement device 18 for safe processing and/or disposal. The separator device 14 is shown and described below with reference to FIGS. 2-4.

Separator Device

FIG. 2 shows an example of the separator device 14. The separator device 14 comprises two pairs of Peltier devices. A first pair of Peltier devices comprises a first Peltier device 22 and a second Peltier device 24. A second pair of Peltier devices comprises a third Peltier device 26 and a fourth Peltier device 28. The separator device 14 further comprises two chambers. In general, the separator device 14 comprises N chambers when the gas mixture comprises N constituent gases. A first chamber is called a condensate accumulator 30. A second chamber is called an evaporator 32. The evaporator 32 is arranged below and is connected to the condensate accumulator 30 via a valve V3 34.

The first Peltier device 22 is mounted on a first side of the condensate accumulator 30. The second Peltier device 24 is mounted to the first Peltier device 22 and a first side of evaporator 32. The third Peltier device 26 is mounted on a second side of the condensate accumulator 30. The fourth Peltier device 28 is mounted to the third Peltier device 26 and a second side of the evaporator 32.

A controller 20 supplies current to the first, second, third, and fourth Peltier devices 22, 24, 26, 28. Cooling assemblies 36, 38 are respectively attached to the second and fourth Peltier devices 24, 28. A coolant (e.g., process chilled water) is circulated through the cooling assemblies 36, 38.

The Peltier devices are described in detail with reference to FIG. 4. Briefly, the coolant in the cooling assemblies 36, 38 is maintained at a first temperature. Accordingly, first sides of the second and fourth Peltier devices 24, 28 adjacent to the cooling assemblies 36, 38 are at the first temperature. When current is supplied to the second and fourth Peltier devices 24, 28, second sides of the second and fourth Peltier devices 24, 28 cool to a second temperature. The second temperature is less than the first temperature. Accordingly, first sides of the first and third Peltier devices 22, 26 adjacent to the second sides of the second and fourth Peltier devices 24, 28 are at the second temperature.

The first and second sides of the evaporator 32 adjacent to the second sides of the second and fourth Peltier devices 24, 28 are also at the second temperature. When current is supplied to the first and third Peltier devices 22, 26, second sides of the first and third Peltier devices 22, 26 cool to a third temperature. The third temperature is less than the second temperature. Accordingly, first and second sides of the condensate accumulator 30 adjacent to the second sides of the first and third Peltier devices 22, 26 are also at the third temperature.

Since the evaporator 32 is at the second temperature and the condensate accumulator 30 is at the third temperature that is less than the second temperature, the evaporator 32 is warmer than the condensate accumulator 30. As explained below, the gas to be bypassed is liquefied in the condensate accumulator 30. The liquid is transferred to the evaporator 32. The evaporator 32 transforms the liquid into a gaseous state. The controller 20 sets the first, second, and third temperatures according the properties of the constituent gases of the gas mixture supplied by the gas source 12.

The condensate accumulator 30 has an inlet 50 connected to the gas source 12. The condensate accumulator 30 has an outlet 52 connected to the process module 16 via a MFC (shown in FIGS. 6A and 6B). The evaporator 32 has an outlet 54 connected to the abatement device 18. The condensate accumulator 30 receives a gas mixture (e.g., acetylene and acetone) from the gas source 12 via the inlet 50. The condensate accumulator 30 is cooled to the third temperature by the first and third Peltier devices 22, 26 as described above. Since acetone has a lower boiling point at 1 atmosphere than acetylene, acetone in the gas mixture condenses and accumulates in the condensate accumulator 30. However, acetylene does not condense and is output through the outlet 52.

The condensate accumulator 30 comprises a level sensor 56. The level sensor 56 senses the level of condensed acetone accumulated in the condensate accumulator 30. When the amount of the condensed acetone accumulated in the condensate accumulator 30 reaches a predetermined level, the controller 20 opens the valve V3 34. The condensed acetone accumulated in the condensate accumulator 30 flows into the evaporator 32.

The evaporator 32 is cooled to the second temperature by the second and fourth Peltier devices 24, 28 as described above. The second temperature is sufficient to convert the condensed acetone into gaseous state. The acetone is output to the abatement device 18 via the outlet 54. The abatement device 18 processes the acetone in a safe manner in compliance with applicable safety regulations.

Valve Block

FIGS. 3A-3C show a system 61 of valves used with the separator device 14. The controller 20 operates the valves in conjunctions with the separator device 14 as follows. FIG. 3A shows a block diagram of the system 61 comprising the separator device 14 and the valves. FIG. 3B shows a valve block 60 on which the valves are arranged. FIG. 3C shows a truth table showing the operations of the valves controlled by the controller 20.

In FIG. 3A, a gas inlet 70 of the valve block 60 (also shown in FIG. 3B) receives the gas mixture (e.g., acetylene and acetone) from the gas source 12. The gas mixture flows through a check valve 72 (check valves are described below) and a valve V2 74 into the inlet 50 of the separator device 14.

A purge gas inlet 71 of the valve block 60 (also shown in FIG. 3B) receives a purge gas (e.g., an inert gas) from a purge gas source (e.g., see gas sources 202 in FIGS. 6A and 6B). The purge gas flows through a check valve 76, a regulator 78, and a valve V1 80 into the inlet 50 of the separator device 14. The regulator 78 regulates flow of the purge gas through the valve V1 80 into the inlet 50 of the separator device 14.

The check valves 72, 76 are one-way valves used to prevent backflow. For example, an inert purge gas such as N2 is usually supplied at a higher pressure than acetylene. When the separator device 14 is being purged, the check valve 76 is closed to prevent backflow of N2 into the facilities supply line, which may be shared across many tools. Similarly, the check valve 72 is closed to prevent backflow of acetylene into the N2 line if the pressure in the separator device 14 increases (e.g., due a component failure). The check valves 72, 76 are small and are stacked under each lock-out tag-out (LOTO) valve (described below). Since the check valves are generally neither complicated nor large, the check valves may be integrated with some models of regulators and valves.

The valve V3 34 is already described above with reference to FIG. 2 and its description is therefore not repeated. The outlet 52 of the condensate accumulator 30 is connected through a valve V4 82 to the process module 16 via a gas outlet 97 of the valve block 60 (also shown in FIG. 3B). More particularly, the outlet 52 of the condensate accumulator 30 is connected through a valve V4 82 to the MFC associated with the process module 16 (shown in FIGS. 6A and 6B) via the gas outlet 97 of the valve block 60. The outlet 54 of the evaporator 32 is connected through a restrictor orifice 84 (described below) to an outlet 98 of the valve block 60 (also shown in FIG. 3B). The outlet 98 of the valve block 60 is connected to the abatement device 18.

The restrictor orifice 84 is a tiny hole in a metal membrane. The restrictor orifice 84 is specifically sized to create an upper limit on total mass flow through the system. The restrictor orifice 84 serves two functions. First, the abatement devices are generally rated to process a predetermined amount of combustible/toxic material at any one time (e.g., to comply with environmental and safety permits). The restrictor orifice 84 is/can be sized to match these ratings. The restrictor orifice 84 limits the total amount of toxics/combustibles going through the abatement device 18 at any one time. Second, if a liquid (of any type) gets into output lines from the evaporator 32 to the abatement device 18, the liquid can stop at the restrictor orifice 84 and slowly evaporate into gas before going into the abatement device 18. Since gas turbo pumps (either part of or upstream of the abatement device 18) can be damaged by the liquid, the restrictor orifice 84 prevents the flow of liquids from going to the gas outlet 97 to the process module 16 to prevent such damage.

A valve V6 88 is connected between the inlet 50 and the outlet 52 of the separator device 14. The operation of the valve V6 88 is described below with reference to the truth table shown in FIG. 3C. An outlet of the valve V6 88 is connected to inlets of the valves V4 82 and V5 86. An outlet of the valve V5 86 is connected between the output 54 of the evaporator 32 and the restrictor orifice 84. The operations of the valves V6 88 and V5 86 are described below with reference to the truth table shown in FIG. 3C.

A switch SW1 90 is connected to the inlet 50 of the separator device 14 and to an inlet of the valve V6 88. A switch SW2 92 is connected between the restrictor orifice 84 and an inlet of the abatement device 18. The switch SW1 90 is an upper safety pressure switch for the system. The switch SW2 92 senses presence of vacuum in the abatement device 18. If switch SW1 90 is tripped, the pressure to the abatement line should be relieved. However, the abatement device 18 is not dedicated (i.e., the abatement device 18 may be shared by multiple process modules). Other factors may impact whether the pressure relief is operational or has the capacity and gas compatibility available to accept the toxic output from the separator device 14. The switch SW2 92 ensures that the line to abatement vacuum system is open.

In some situations, the gas to be vented should be contained at a higher pressure inside the separator device 14 rather than venting the gas out to avoid creating potentially unsafe conditions. For example, potentially unsafe conditions comprise mixing the gas with a hypergolic/incompatible gas, filling a line that might be under maintenance, etc. According to industry standards, hardware relay interlocks are used to indicate presence of these types of safety conditions. These switches are the backup, independent sensors that create a safety interlock system.

FIG. 3B shows the valve block 60. The valve block 60 comprises the valves V1 80, V2 74, V3 34, V4 82, V5 86, and V6 88. The valve block 60 comprises the switches SW1 90 and SW2 92 (shown as S1 and S2, respectively). In addition, the valve block 60 comprises lock-out tag-out (LOTO) valves 93, 94, 95, 96. The LOTO valves are manual valves. The LOTO valves are an industry standard for any types of systems that might be used to contain toxic dispersal or potential hazards. The LOTO valves are used to isolate portions of systems where the hazard is not relevant to work being performed. For example, a component downstream of the separator device 14 (e.g., the MFC) may need to be replaced. Such replacement would ordinarily require breaking the gas line system and potentially venting the gas in the separator device 14 to atmosphere. Instead, with the LOTO valves, service personnel can close the relevant LOTO valve to isolate the separator device 14. Placing a safety lock with a tag on the closed LOTO valve can prevent someone else from opening the LOTO valve while work is being performed on a downstream component.

FIG. 3C shows the truth table. The truth table indicates how the controller 20 controls the valves V1 80, V2 74, V3 34, V4 82, V5 86, and V6 88. In the truth table, X indicates that a valve is closed. O indicates that a valve is open. DC indicates a don't care (DC) condition (i.e., whether a valve is open or closed is irrelevant). If an error occurs (e.g., the switch SW2 92 not detecting vacuum for the abatement device 18), all the valves are closed to prevent a potentially hazardous condition. To flow the gas (e.g., acetylene) from the outlet 52 of the separator device 14 to the process module 16, valves V1 80, V3 34, V5 86, and V6 88 are closed. Valves V2 74 and V4 84 are open. To divert the flow the gas (e.g., acetone) from the outlet 54 of the separator device 14 to the abatement device 18, valves V3 34, V4 82, and V6 88 are closed. Valve V5 86 is open. Whether valves V1 80 and V2 74 are open or closed is irrelevant. To move the liquid from the condensate accumulator 30 to the evaporator 32, valve V3 34 is open. Whether valves V1 80, V2 74, V4 82, V5 86, and V6 88 are open or closed is irrelevant. To purge the separator device 14, valves V1 80, V3 34, and V5 86 are open. Valves V2 74 and V4 82 are closed. Whether valve V6 88 is open or closed is irrelevant.

Peltier Device

FIG. 4 shows an example of a Peltier device 100. The following description of the Peltier device 100 applies equally to the first, second, third, and fourth Peltier devices 22, 24, 26, and 28. The Peltier device 100 operates as a thermoelectric cooler due to the Peltier effect. The Peltier device 100 comprises a first plate 102 and a second plate 104. A plurality of pillars 106, 108 of P- and N-type semiconductor materials are arranged in an alternating manner and are connected in series with each other. The pillars 106, 108 are arranged between the first and second plates 102, 104. An interconnecting material 110 interposed between the pillars 106, 108 and the first and second plates 102, 104.

The controller 20 (shown in FIG. 2) supplies a direct current (DC) that flows through the Peltier device 100. Heat from a first side (e.g., the first plate 102) of the Peltier device 100 is transferred to a second side (e.g., the second plate 104) of the Peltier device 100. Consequently, the first side of the Peltier device 100 gets cooler while the second side of the Peltier device 100 gets hotter. The second side is attached to a heat sink (e.g., the cooling assemblies 36, 38 shown in FIG. 2). Consequently, the second side remains at a predetermined temperature maintained by the heat sink while the first side cools to below the predetermined temperature.

The controller 20 (shown in FIG. 2) applies a DC voltage across terminals 112, 114 (i.e., across the pillars 106, 108) of the Peltier device 100. A DC current flows across the PN junctions causing a temperature difference. The first side (e.g., the first plate 102) absorbs heat from any object in contact with the first side (e.g., the condensate accumulator 30 or the evaporator 32). The absorbed heat is transported by the pillars 106, 108 to the second side (e.g., the second plate 104) of the Peltier device 100.

The cooling ability of the Peltier device 100 is proportional to the total area of cross section of all the pillars 106, 018. The length of the pillars 106, 018 is a balance between longer pillars and shorter pillars. Longer pillars will have a greater thermal resistance between the sides and will allow a lower temperature to be reached but will produce more resistive heating (i.e., waste heat). Shorter pillars will have a greater electrical efficiency but will let more heat leak from the hot to cold side by thermal conduction. For large temperature differences, longer pillars are less efficient than stacking separate, progressively larger (i.e., thicker) pillars. The pillars get progressively larger since each pillar has to remove both the heat moved by the adjacent pillar and the waste heat of the pillar itself.

FIG. 5 shows an example of a system 150 comprising multiple separator devices used with multiple process modules. The multiple separator devices comprise a redundant separator device used with multiple process modules. For example, the system 150 comprises three separator devices 14-1, 14-2, 14-3 and two process modules PM1 16-1, PM2 16-2 arranged in a 3×2 configuration. The separator device 14-1 receives gases (purge gas and/or gas mixture) via input valves V1 80, V2 74. The separator device 14-1 separates the constituent gases of the gas mixture. The separator device 14-1 outputs the primary and secondary gases respectively to the process module PM1 16-1 and the abatement device 18. The separator device 14-2 also receives the gases via input valves V1 80, V2 74. The separator device 14-2 separates the constituent gases of the gas mixture. The separator device 14-2 outputs the primary and secondary gases respectively to the process module PM2 16-2 and the abatement device 18.

The third separator device 14-3 is connected to the process modules PM1 16-1, PM2 16-2, and the abatement device 18. The third separator device 14-3 also receives the gases via input valves V1 80, V2 74. The third separator device 14-3 separates the constituent gases of the gas mixture. The third separator device 14-3 can output the primary gas to both the process modules PM1 16-1, PM2 16-2. The third separator device 14-3 can output the secondary gas to the abatement device 18.

If the separator device 14-1 or the separator device 14-2 fails, the third separator device 14-3 takes the place of the failed separator device. The system as a whole can continue functioning uninterrupted while maintenance is scheduled and performed. The controller 20 (shown in FIG. 2) can deactivate the failed separator device and activate the third separator device 14-3 instead. The failed separator device can be serviced while the system can continue operation without interruption.

Examples of Substrate Processing Systems

FIGS. 6A and 6B show examples of substrate processing systems (hereinafter tools) employing the separator devices of the present disclosure. FIG. 6A shows an example of a tool where the separator devices are centrally controlled by a system controller of the tool. The system controller performs the functions of the controller 20 shown in FIG. 2. FIG. 6B shows an example of a tool where the separator devices comprise respective controllers (e.g., the controller 20 shown in FIG. 2). Accordingly, the separator devices are independent and standalone devices that can be serviced while the tool continues to operate normally. In FIGS. 6A and 6B, for simplicity of illustration, examples of redundant configurations of the separator devices are not shown. However, redundant separator devices can be added to the tools shown in FIGS. 6A and 6B according to the teachings of the present disclosure.

FIG. 6A shows an example of a tool 200. The tool 200 comprises gas and precursor sources (hereinafter collectively called the gas sources) 202. In addition to precursors, non-limiting examples of the gases supplied by the gas sources 202 comprise reactants, inert gases, and other gases. The tool 200 comprises a plurality of separator devices 14-1, 14-2, 14-3, 14-4 (collectively the separator devices 14) and respective valve blocks 60-1, 60-2, 60-3, 60-4 (collectively the valve blocks 60). The tool 200 comprises the abatement device 18 shared by the separator devices 14. Alternatively, while not shown, depending on the chemistries of the gases and safety regulations therefor, one or more of the separator devices 14 may be connected to respective abatement devices.

The tool 200 comprises a plurality of mass flow controllers (MFCs) 206-1, 206-2, 206-3, 206-4 (collectively the MFCs 206). The MFCs 206 control the flow of the gases supplied by the respective separator devices 14. The MFCs 206 supply the controlled mass flow of the gases to respective pulse valve manifolds (PVMs) 208-1, 208-2, 208-3, and 208-4 (collectively the PVMs 208).

The tool comprises a plurality of process modules (PMs) 210-1, 210-2, 210-3, and 210-4 (collectively the PMs 210). The PMs 210 comprise respective showerheads 209-1, 209-2, 209-3, and 209-4 (collectively the showerheads 209). The PVMs 208 are connected to respective showerheads 209. The PVMs 208 supply the gases received from the respective MFCs 206 to the respective PMs 210. The PVMs 208 supply the gases to the PMs 210 via the respective showerheads 209. The PVMs 208 supply the gases at a predetermined temperature and pressure. Only four PMs 210 are shown for example only. The tool 200 may comprise N PMs 210, where N is an integer greater than 2.

The tool 200 further comprises a system controller 214. The system controller 214 controls the gas sources 202, the separator devices 14 and the valve blocks 60, the MFCs 206, components of the PMs 210, and other elements of the tool 200. Examples of the components of the PMs 210 and the other elements of the tool 200 are shown and described below with reference to FIGS. 7 and 8.

FIG. 6B shows another example of a tool 201. The tool 201 differs from the tool 200 shown in FIG. 6A in that the separator devices 14-1, 14-2, 14-3, 14-4 comprise respective controllers 20-1, 20-2, 20-3, 20-4 (collectively the controllers 20). The controllers 20 are similar to the controller 20 shown and described above with reference to FIG. 2. The system controller 214 communicates with the controllers 20 to receive statuses of the separator devices 14. Other than this difference, the tool 201 is identical to the tool 200 shown in FIG. 6A. Since the controllers 20-1, 20-2, 20-3, 20-4 are integrated with the respective separator devices 14-1, 14-2, 14-3, 14-4, the separator devices 14-1, 14-2, 14-3, 14-4 function as independent standalone units.

FIG. 7 shows an example of the PM 210, which can be any of the PMs 210 of the tool 200. For example, the PM 210 can be an ALD station. That is, the PM 210 can be used to perform an ALD process on a substrate in the PM 210. Another example of the PM 210 that can perform a PECVD process on a substrate is shown and described below with reference to FIG. 8. While ALD and PECVD processes are described as illustrative examples, other processes can be performed on substrates in the PMs 210.

In FIG. 7, the PM 210 is configured to process a substrate 272 using an ALD process (e.g., using thermal ALD or T-ALD). The PM 210 comprises a substrate support (e.g., a pedestal) 270. During processing, the substrate 272 is arranged on the pedestal 270. One or more heaters 274 (e.g., a heater array, zone heaters, etc.) may be arranged in the pedestal 270 to heat the substrate 272 during processing. Additionally, one or more temperature sensors 276 are disposed in the pedestal 270 to sense the temperature of the pedestal 270. The system controller 214 receives the temperature of the pedestal 270 sensed by the temperature sensors 276. The system controller 214 controls power supplied to the heaters 274 based on the sensed temperature.

The PM 210 further comprises the showerhead 209. The showerhead 209 introduces and distributes process gases received from the PVM 208 into the PM 210. The showerhead 209 comprises a stem portion 280. One end of the stem portion 280 is connected to a top plate 281 enclosing the PM 210. The PVM 208 is mounted to a top plate 281 above the showerhead 209 using at least two mounting legs 283-1, 283-2.

The PVM 208 is connected to the stem portion 280 of the showerhead 209 via an adapter 282. The adapter 282 comprises a first flange 279-1 on a first end and a second flange 279-2 on a second end of the adapter 282. The flanges 279-1, 279-2 are respectively fastened to the bottom of the PVM 208 and to the stem portion 280 of the showerhead 209 by fasteners 287-1 through 287-4. The adapter comprises bores 285-1, 285-2 (collectively the bores 285). The bores 285 are in fluid communication with the PVM 208 and the stem portion 280 of the showerhead 209. A base portion 284 of the showerhead 209 is generally cylindrical. The base portion 284 extends radially outwardly from an opposite end of the stem portion 280 at a location that is spaced from a top surface of the PM 210.

A substrate-facing surface of the base portion 284 of the showerhead 209 comprises a faceplate 286. The faceplate 286 comprises a plurality of outlets or features (e.g., slots or through holes) 288. The outlets 288 of the faceplate 286 are in fluid communication with the PVM 208 through the bores 285 of the adapter 282. The process gases flow from the PVM 208 through the bores 285 and the outlets 288 into the PM 210.

Additionally, while not shown, the showerhead 209 also comprises one or more heaters. The showerhead 209 comprises one or more temperature sensors 290 to sense the temperature of the showerhead 209. The system controller 214 receives the temperature of the showerhead 209 sensed by the temperature sensors 290. The system controller 214 controls power supplied to the one or more heaters in the showerhead 209 based on the sensed temperature.

An actuator 292 is operable to move the pedestal 270 vertically relative to the showerhead 209, which is stationary. By vertically moving the pedestal 270 relative to the showerhead 209, a gap between the showerhead 209 and the pedestal 270 (i.e., between the substrate 272 and the faceplate 286 of the showerhead 109) can be varied. The gap can be varied dynamically during a process or between processes performed on the substrate 272. During processing, the faceplate 286 of the showerhead 209 can be closer to the pedestal 270 than shown.

A valve 294 is connected to an exhaust port of the PM 210 and to the vacuum pump 296. The vacuum pump 296 can maintain sub-atmospheric pressure inside the PM 210 during substrate processing. The valve 294 and the vacuum pump 296 are used to control pressure in the PM 210 and to evacuate exhaust gases and reactants from the PM 210. The system controller 214 controls these additional components associated with the PM 210.

FIG. 8 shows another example of the PM 210 configured to perform a PECVD process on the substrate 272. All elements of FIG. 8 that are also shown in FIG. 7 with identical reference numerals are not described again for brevity. Additionally, to perform the PECVD process, the tool 200 may comprise a radio frequency (RF) generating system (or an RF source) 250. The RF generating system 250 generates and outputs an RF voltage. The RF voltage may be applied to the showerhead 209. The pedestal 270 can be DC grounded, alternating current (AC) grounded, or floating as shown. Alternatively, while not shown, the RF voltage can be applied to the pedestal 270. The showerhead 209 may be DC grounded, AC grounded, or floating.

For example, the RF generating system 250 may comprise an RF generator 252.

The RF generator 252 generates RF power. The RF power is fed by a matching and distribution network 254 to the showerhead 209 or the pedestal 270. In some examples, a vapor delivery system 256 supplies a vaporized precursor to the PVM 208. The RF voltage supplied to the showerhead 209 or the pedestal 270 strikes plasma in the PM 210 to perform a PECVD process on the substrate 272. Alternatively, inductive plasma or plasma generated remotely from (i.e., external to) the PM 210 may be used to perform the PECVD process.

The foregoing description is merely illustrative in nature and is not intended to limit the disclosure, its application, or uses. The broad teachings of the disclosure can be implemented in a variety of forms. Therefore, while this disclosure comprises particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as comprising certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, comprising "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, comprising a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate.

The electronics may be referred to as the "controller," which may control various components or subparts of the system or systems. The controller, depending on the processing requirements and/or the type of system, may be programmed to control any of the processes disclosed herein, comprising the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics comprising various integrated circuits, logic, memory, and/or software that receive instructions, issue instructions, control operation, enable cleaning operations, enable endpoint measurements, and the like. The integrated circuits may comprise chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process.

In some examples, a remote computer (e.g. a server) can provide process recipes to a system over a network, which may comprise a local network or the Internet. The remote computer may comprise a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control.

Thus, as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may comprise a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A gas separator device comprising:

a first chamber comprising a first inlet to receive a gas mixture comprising first and second gases, and a first outlet;

first and second Peltier devices mounted to the first chamber to cool the first chamber to a first temperature;

a second chamber connected to the first chamber and comprising a second outlet; and third and fourth Peltier devices mounted to the first and second Peltier devices, respectively, and to the second chamber to cool the second chamber to a second temperature that is greater than the first temperature;

wherein the first, second, third, and fourth Peltier devices are configured to:

condense the second gas in the gas mixture in the first chamber and output the first gas via the first outlet; and transform the condensed second gas received from the first chamber in the second chamber into the second gas and output the second gas via the second outlet.

2. The gas separator device of claim 1 further comprising a controller configured to supply a first voltage to the first and second Peltier devices to cool the first chamber to the first temperature and a second voltage to the third and fourth Peltier devices to cool the second chamber to the second temperature.

3. The gas separator device of claim 1 further comprising a cooling assembly attached to the third and fourth Peltier devices to cool opposite sides of the third and fourth Peltier device to a third temperature that is greater than the second temperature.

4. The gas separator device of claim 1 further comprising:

a valve selectively connecting the first and second chambers; and a controller configured to control the valve to selectively transfer the condensed second gas from the first chamber to the second chamber.

5. The gas separator device of claim 4 further comprising:

a level sensor to sense a level of the condensed second gas in the first chamber, wherein the controller is configured to control the valve based on the level.

6. The gas separator device of claim 1 wherein:

the first outlet supplies the first gas to a substrate processing chamber via a mass flow controller; and the second outlet supplies the second gas to an abatement device.

7. The gas separator device of claim 1 wherein the gas separator device is located in a substrate processing tool.

8. The gas separator device of claim 1 further comprising:

a plurality of valves; and a controller configured to control the valves to at least one of:

shut down the gas separator device in response to an error;

control flow of the first gas from the first outlet to a substrate processing chamber;

divert flow of the first gas from the second outlet to an abatement device;

purge the gas separator device; and prevent backflow of gases from the gas separator device into systems upstream of the gas separator device.

9. A system comprising:

a plurality of the gas separator device of claim 1;

a plurality of substrate processing chambers; and an abatement device;

wherein a first gas separator device of the plurality of the gas separator device receives the gas mixture, supplies the first gas to a first one of the substrate processing chambers, and supplies the second gas to the abatement device; and wherein a second gas separator device of the plurality of the gas separator device receives the gas mixture, supplies the first gas to a second one of the substrate processing chambers, and supplies the second gas to the abatement device.

10. The system of claim 9 wherein a third gas separator device of the plurality of the gas separator device receives the gas mixture, and in response to the first gas separator device failing, supplies the first gas to the first one of the substrate processing chambers and supplies the second gas to the abatement device.

* * * * *